United States Patent
Ishizeki

(10) Patent No.: US 8,873,648 B2
(45) Date of Patent: Oct. 28, 2014

(54) SERIAL COMMUNICATION APPARATUS

(75) Inventor: Yoshiaki Ishizeki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/983,882

(22) PCT Filed: Feb. 24, 2012

(86) PCT No.: PCT/JP2012/001277
§ 371 (c)(1),
(2), (4) Date: Aug. 6, 2013

(87) PCT Pub. No.: WO2012/132215
PCT Pub. Date: Oct. 4, 2012

(65) Prior Publication Data
US 2013/0315294 A1  Nov. 28, 2013

(30) Foreign Application Priority Data
Mar. 31, 2011  (JP) .................. 2011-078263

(51) Int. Cl.
| H04B 3/00 | (2006.01) |
| H04L 25/03 | (2006.01) |
| H03K 19/0175 | (2006.01) |
| H03K 19/0185 | (2006.01) |
| H03K 17/16 | (2006.01) |

(52) U.S. Cl.
CPC .. H04L 25/03885 (2013.01); H03K 19/017545 (2013.01); H03K 19/018521 (2013.01); H03K 17/166 (2013.01)
USPC .............................. 375/257; 375/296; 326/27

(58) Field of Classification Search
CPC .................... H03F 2200/414; H03F 2200/417; H04B 1/0458; H03K 17/163; H03K 17/166; H03K 19/017545
USPC ...................... 375/257, 295, 296; 326/26, 27
See application file for complete search history.

(56) References Cited

U.S. PATENT DOCUMENTS

| 5,548,240 | A | * | 8/1996 | Bayer ........................... 327/432 |
| 6,222,403 | B1 | | 4/2001 | Mitsuda |
| 2008/0258702 | A1 | | 10/2008 | Kanamaru et al. |
| 2010/0308859 | A1 | * | 12/2010 | Chimakurty et al. ........... 326/27 |
| 2011/0234257 | A1 | * | 9/2011 | Kwon et al. ..................... 326/26 |
| 2013/0101064 | A1 | * | 4/2013 | Sorrells et al. ................ 375/295 |

FOREIGN PATENT DOCUMENTS

| JP | 11-346147 A | 12/1999 |
| JP | 2000-209078 A | 7/2000 |
| JP | 2008-271224 A | 11/2008 |
| JP | 2009-111470 A | 5/2009 |
| JP | 2010-028357 A | 2/2010 |

* cited by examiner

Primary Examiner — Don N Vo
(74) Attorney, Agent, or Firm — Sughrue Mion, PLLC

(57) ABSTRACT

A serial communication apparatus includes a slew rate control circuit, an output circuit, a detection circuit, and a switching circuit. The slew rate control circuit has a predetermined impedance, and supplies a constant current from an output according to an input signal. In the output circuit, first capacitance is charged and discharged by the constant current from the slew rate control circuit. The output circuit outputs a digital signal from an output terminal according to a drive voltage. The noise detection circuit detects noise propagated from the output terminal, and outputs a switching signal according to a detection result. The switching circuit switches an impedance of the slew rate control circuit to a value smaller than the predetermined impedance according to the switching signal.

16 Claims, 11 Drawing Sheets

SERIAL COMMUNICATION APPARATUS

CROSS REFERENCE TO RELATED APPLICATIONS

This is a National Stage of International Application No. PCT/JP2012/001277, filed Feb. 24, 2012, claiming priority from Japanese Patent Application No. 2011-078263, filed Mar. 31, 2011, the contents of all of which are incorporated herein by reference in their entirety.

TECHNICAL FIELD

The present invention relates to a serial communication apparatus and, in particular, to a serial communication apparatus having noise resistance.

BACKGROUND ART

In recent automobiles, networks of open drain (wired OR) forms, such as an ISO-9141 (a K line) and an LIN (Local Interconnect Network), are utilized as in-vehicle communication networks. Since such networks do not employ differential communication, they can be easily configured by a few numbers of wirings, and are frequently used for a system with a relatively low communication speed. A communication speed of the LIN is approximately 20 Kbps, and a communication speed of the K line is approximately 100 Kbps.

Generally, for ensuring safety, high reliability is required for communication networks applied to automobiles etc. In a system in which a number of communication networks and power supply wirings are concentrated in a closed environment, such as an automobile, EMI (Electro-Magnetic Interference) that a communication line (wire harness) radiates becomes a noise source. Accordingly, other systems must be prevented from malfunctioning due to this noise. Namely, in order to prevent systems other than a noise radiation source from malfunctioning by noise, a technique to dull a communication waveform by, for example, slew rate control is used in a communication line. As a result of this, a harmonic component in the communication waveform that acts as EMI noise can be suppressed.

In addition, the above-described communication line also serves as an antenna that receives EMI radiated by the other systems. Therefore, simultaneous pursuit of EMS (Electro-Magnetic Susceptibility) not to cause malfunction, such as the output circuit itself losing communication data when the antenna receives the EMI, is also an essential requirement.

There will be described an example of a circuit that performs slew rate control of a communication waveform used for noise suppression (Patent Literature 1). FIG. 9 is a block diagram showing a configuration of a slew rate output circuit 500. As shown in FIG. 9, the slew rate output circuit 500 includes a slew rate control circuit 51, an output circuit 52, and an output terminal Tout. A load RL is connected between the output terminal Tout and a power supply line Vdd. Power is supplied to the slew rate output circuit 500 from a power supply line Vcc.

FIG. 10 is a circuit diagram showing the configuration of the slew rate output circuit 500. Hereinafter, the configuration and operation of the slew rate output circuit 500 will be described with reference to FIG. 10. The slew rate output circuit 500 has an N-channel output transistor Q0 the source electrode of which has been grounded, and the load RL connected between the power supply line Vdd and the drain electrode thereof. The slew rate output circuit 500 is the open drain type slew rate output circuit that performs charge and discharge control of gate electrode capacitances Cdg and Cgs of the output transistor Q0 by two constant currents IrH and IrL respectively from a CS51 and a CS52.

When changing from a low level to a high level, an input pulse signal Vin is inverted by inverters INV51 and INV52, and gates of a P-channel transistor Q1 and an N-channel transistor Q2 both become the low level. Therefore, the P-channel transistor Q1 becomes an on state, the N-channel transistor Q2 becomes an off state, and the gate electrode capacitances Cdg and Cgs of the output transistor Q0 are charged by the constant current IrH from the constant current source CS51. As a result of it, a gate voltage Vgate gradually becomes the high level, and the output transistor Q0 slowly becomes the on state. When the input pulse signal Vin shifts from the high level to the low level, the P-channel transistor Q1 becomes the off state, the N-channel transistor Q2 becomes the on state, and the gate electrode capacitances Cdg and Cgs of the output transistor Q0 are discharged by the constant current IrL from the constant current source CS52. As a result of it, the gate voltage Vgate gradually becomes the low level, and the output transistor Q0 slowly becomes the off state.

FIG. 11 is a timing chart showing operation of the slew rate output circuit 500. As shown in FIG. 11, not only a rise time of the gate voltage Vgate but a fall time of the output voltage Vout change depending on the gate electrode capacitances Cdg and Cgs of the output transistor Q0, and a value of the constant current IrH. In addition, not only a fall time of the gate voltage Vgate but also a rise time of the output voltage Vout change depending on a value of the constant current IrL. This is because charge and discharge times of the gate electrode capacitances Cdg and Cgs of the output transistor Q0 change depending on the constant currents IrH and IrL. Namely, the slew rate output circuit 500 has achieved the above-mentioned slew rate control by controlling the values of the constant currents IrH and IrL.

In addition to that, a drive circuit has been proposed that can easily control a slew rate while suppressing a circuit size (Patent Literature 2).

CITATION LIST

Patent Literature

Patent Literature 1: Japanese Unexamined Patent Application Publication No. H11-346147
Patent Literature 2: Japanese Unexamined Patent Application Publication No. 2009-111470

SUMMARY OF INVENTION

Technical Problem

However, the inventor has found out that there is the following problem in the slew rate output circuit 500. According to the inventor's examination, when communication line noise Vn is introduced into the output terminal Tout, the slew rate output circuit 500 is at risk of malfunction. Hereinafter, a mechanism of malfunction will be described.

When the communication line noise Vn is introduced into the output terminal Tout, a high frequency component of the communication line noise Vn is added to the gate voltage Vgate through the drain-to-gate capacitance Cdg of the output transistor Q0 (a timing T51 of FIG. 11). Therefore, the gate voltage Vgate has a waveform that vibrates up and down, and frequently straddles a threshold value Vt of the output transistor Q0. As a result of it, it becomes impossible for the output transistor Q0 to keep a stable off state. Therefore, the output voltage Vout cannot output a high level (a VB voltage), and lack of a desired waveform (wave form after the timing T51) occurs.

In other words, the slew rate output circuit 500 malfunctions by having been subjected to the communication line noise. Accordingly, it becomes impossible to establish communication under an environment where large noise exists in a communication line.

Solution to Problem

A serial communication apparatus according to one aspect of the present invention includes: a slew rate control circuit that has a predetermined impedance, and supplies a constant current from an output according to an input signal; an output circuit that has a first capacitance charged and discharged by the constant current from the slew rate control circuit, and outputs from an output terminal a digital signal according to a drive voltage that the first capacitance outputs; a detection circuit that detects noise propagated from the output terminal, and outputs a switching signal according to a detection result; and a switching circuit that switches an impedance of the slew rate control circuit to a value smaller than the predetermined impedance according to the switching signal. Thus, amplitude of a noise added to a drive voltage can be suppressed, and a communication error due to the lack of a communication waveform can be prevented.

A serial communication apparatus according to one aspect of the present invention includes: an output circuit that drives a load connected to an output terminal; a slew rate control circuit that generates a drive signal for driving the output circuit according to an input signal, and controls a slew rate of the drive signal; a noise detection circuit that detects noise propagated to an output signal output from the output terminal; and a switching circuit that switches an impedance of the slew rate control circuit so that the impedance becomes smaller as compared with a case where the noise has not been detected, when the noise detection circuit detects the noise. Thus, amplitude of a noise added to a drive voltage can be suppressed, and a communication error due to the lack of a communication waveform can be prevented.

Advantageous Effects of Invention

According to the present invention, a serial communication apparatus can be provided that can prevent the lack of a communication waveform to suitably prevent malfunction that causes non-establishment of communication even when a communication line is subjected to noise, while suppressing EMI that the communication line radiates at the time of normal operation.

DESCRIPTION OF EMBODIMENTS

Hereafter, embodiments of the present invention will be described with reference to drawings. In each drawing, the same symbol is given to the same component, and duplicative description is omitted if needed.

First Embodiment

Figure 1:
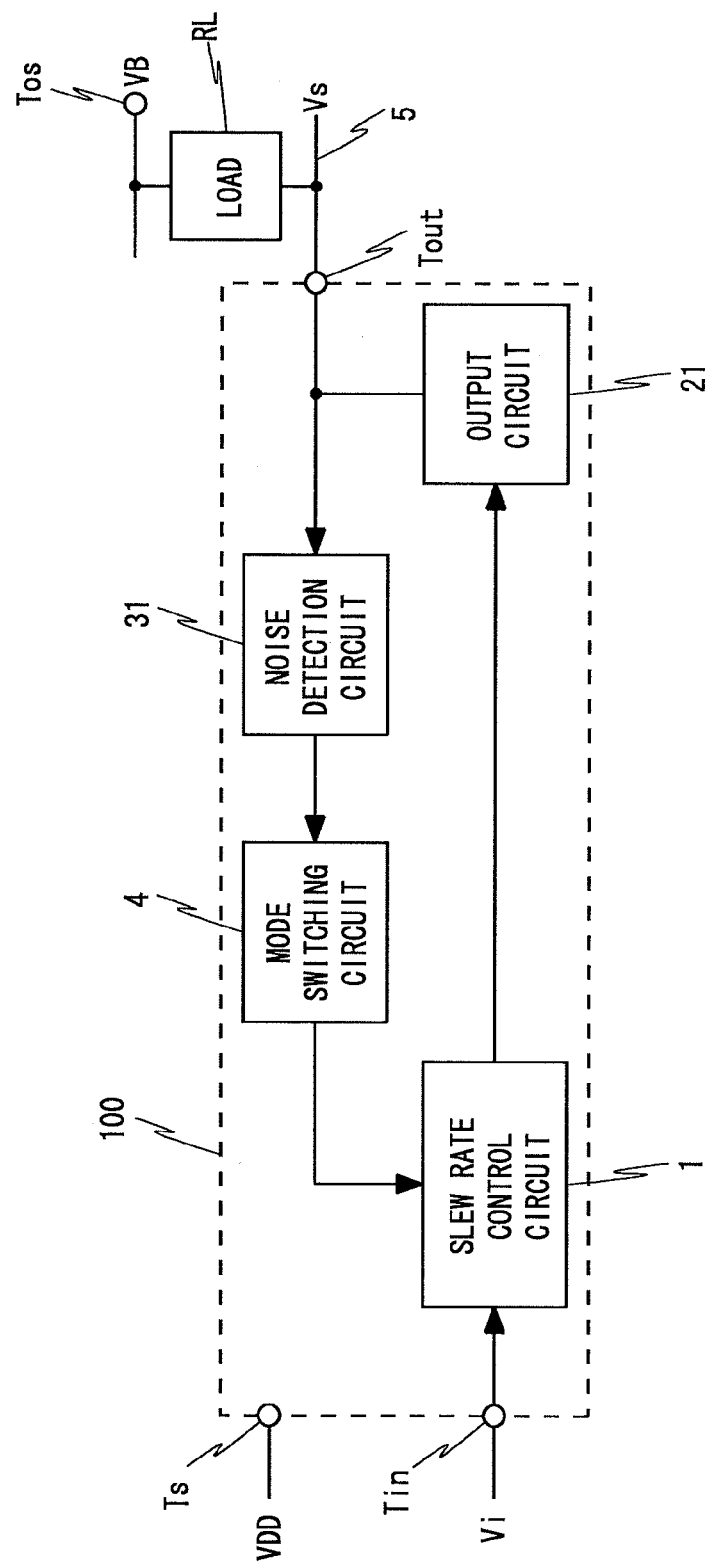
FIG. 1 is a block diagram showing a configuration of a serial communication apparatus 100 according to a first embodiment.

There will be described a serial communication apparatus 100 according to a first embodiment of the present invention. FIG. 1 is a block diagram showing a configuration of the serial communication apparatus 100 according to the first embodiment. The serial communication apparatus 100 includes: a slew rate control circuit 1; an output circuit 21; a noise detection circuit 31; a mode switching circuit 4; an input terminal Tin; an output terminal Tout; and a power supply terminal Ts. An input signal Vi is supplied to the input terminal Tin. In addition, a power supply voltage VDD is supplied to the power supply terminal Ts. The output terminal Tout is connected to an external power supply terminal Tos through a communication line 5 and a load RL. A voltage of the communication line 5 is set as a communication line voltage Vs. An external power supply voltage VB is supplied to the external power supply terminal Tos.

Here, the noise detection circuit 31 corresponds to a detection circuit, and the mode switching circuit 4 corresponds to a switching circuit. The power supply terminal Ts corresponds to a first power supply terminal. The external power supply terminal Tos corresponds to a third power supply terminal.

Figure 2:
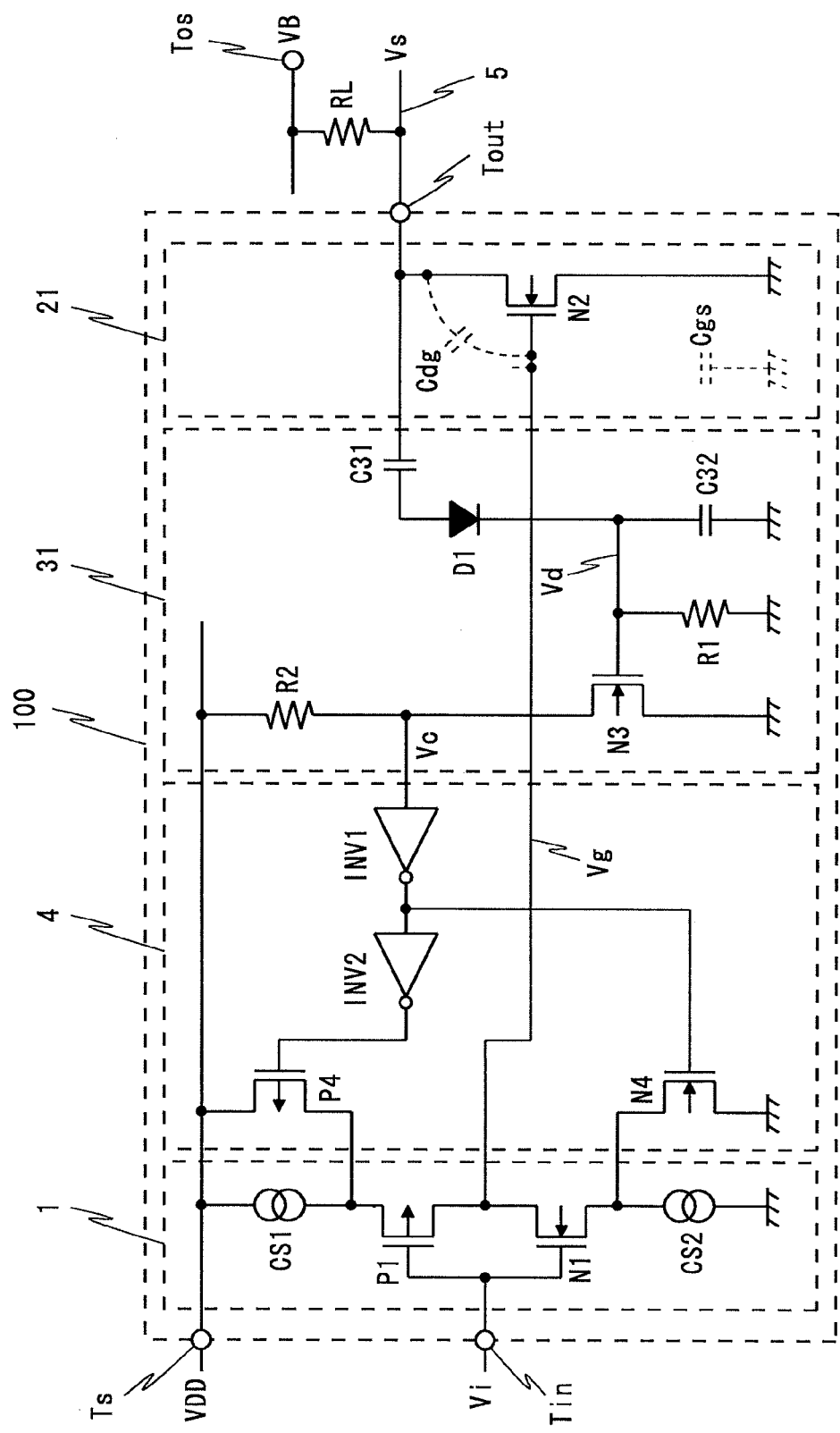
FIG. 2 is a circuit diagram showing the configuration of the serial communication apparatus 100 according to the first embodiment.

The serial communication apparatus 100 will be further described with reference to FIG. 2. FIG. 2 is a circuit diagram showing the configuration of the serial communication apparatus 100 according to the first embodiment. The slew rate control circuit 1 includes: a first constant current source CS1; a second constant current source CS2; a Pch transistor P1; and an Nch transistor N1. Grounds in FIG. 2 correspond to second power supply terminals. The first constant current source CS1, the second constant current source CS2, the Pch transistor P1, and the Nch transistor N1 are connected in a cascade manner between the power supply terminal Ts to which the power supply voltage VDD is supplied and the ground.

Figure 11:
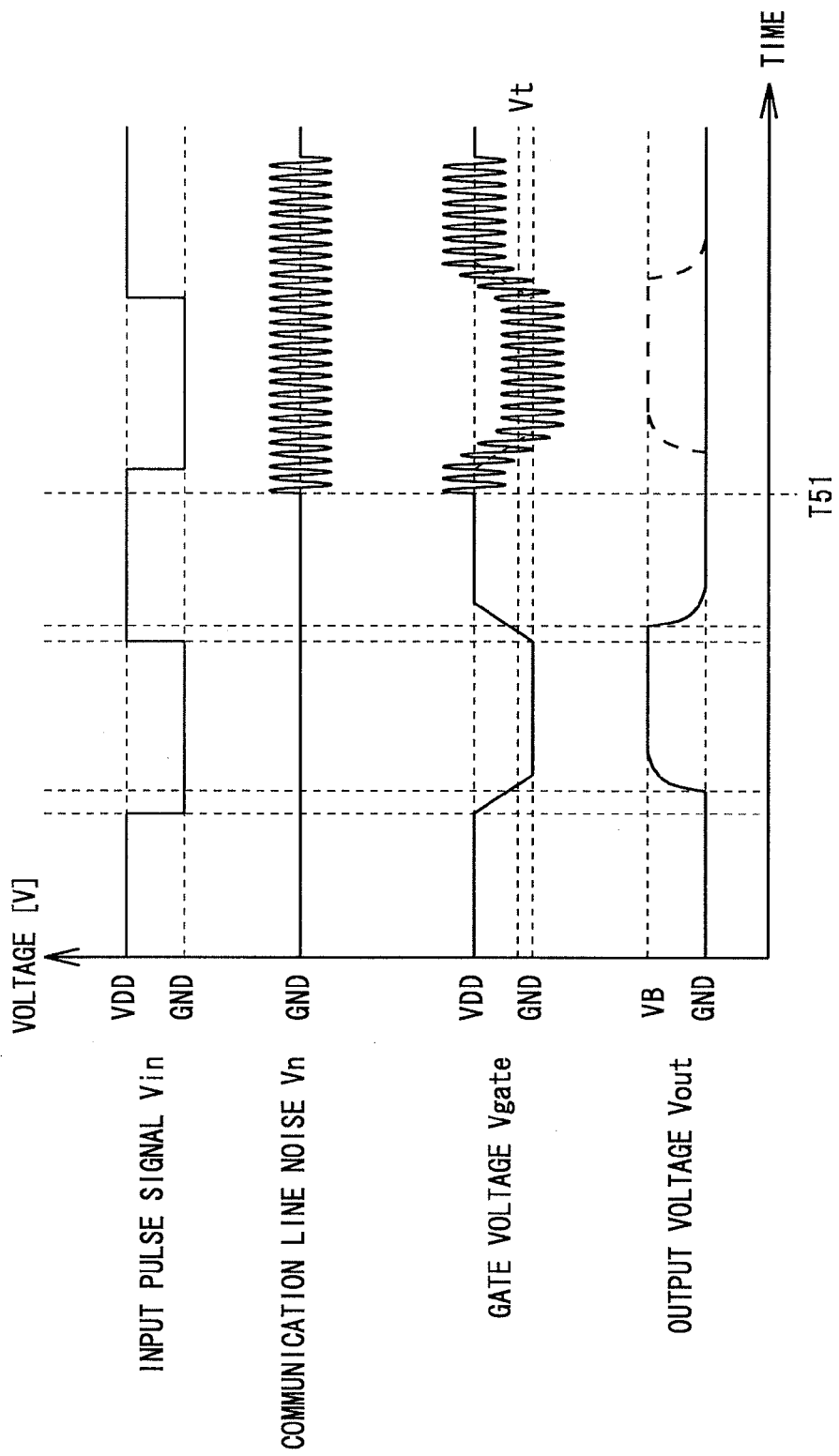
FIG. 11 is a timing chart showing operation of the slew rate output circuit 500.

Specifically, the source of the Pch transistor P1 is connected to the power supply terminal Ts through the first constant current source CS1. The drain of the Pch transistor P1 is connected to the drain of the Nch transistor N1. The source of the Nch transistor N1 is connected to the ground through the second constant current source CS2. The input signal Vi is input to the gates of the Pch transistor P1 and the Nch transistor N1 from the input terminal Tin. Namely, the Pch transistor P1 and the Nch transistor N1 configure an inverter. A voltage of a node (connection point) between the drains of the Pch transistor P1 and the Nch transistor N1, which is an output of the inverter, is set as a drive voltage Vg. It is to be noted that the drive voltage Vg corresponds to a gate voltage Vgate shown in FIG. 11.

The output circuit 21 is configured by an Nch transistor N2. The Nch transistor N2 corresponds to a fourth transistor, and the gate corresponds to a control terminal. The drain of the Nch transistor N2 is connected to the output terminal Tout. The source of the Nch transistor N2 is connected to the ground. The gate of the Nch transistor N2 is connected to the drain (connection point) of the Pch transistor P1 and the Nch transistor N1, and the drive voltage Vg is applied to the gate. It is to be noted that a drain-to-gate capacitance Cdg exists between the drain and the gate of the Nch transistor N2. In addition, a gate-to-source capacitance Cgs exists between the gate and the source of the Nch transistor N2. In FIG. 2, the drain-to-gate capacitance Cdg and the gate-to-source capacitance Cgs are represented by dotted lines. It is to be noted that the gate-to-source capacitance Cgs of the Nch transistor N2 corresponds to a first capacitance.

The noise detection circuit 31 includes: capacitances C31 and C32; a diode D1; resistors R1 and R2, and an Nch transistor N3. Here, the capacitances C31 and C32 correspond to second and third capacitances, respectively. The diode D1 corresponds to a rectifier. The resistors R1 and R2 correspond to first and second resistors, respectively. The Nch transistor N3 corresponds to a third transistor, and the gate corresponds to a control terminal.

The anode of the diode D1 is connected to the output terminal Tout through the capacitance C31. The resistor R1 and the capacitance C32 are connected between the cathode of the diode D1 and the grounds, respectively. The drain of the Nch transistor N3 is connected to the power supply terminal Ts through the resistor R2, and outputs a switching signal Vc. The source of the Nch transistor N3 is connected to the ground. The gate of the Nch transistor N3 is connected to the cathode of the diode D1, and receives a noise detection signal Vd.

The mode switching circuit 4 includes: inverters INV1 and INV2; a Pch transistor P4; and an Nch transistor N4. Here, the inverters INV1 and INV2 correspond to first and second inverters, respectively. The Pch transistor P4 and the Nch transistor N4 correspond to first and second transistors, respectively, and gates correspond to control terminals.

The source of the Pch transistor P4 is connected to the power supply terminal Ts. The drain of the Pch transistor P4 is connected to a connection point of the first constant current source CS1 and the Pch transistor P1. Namely, the Pch transistor P4 is connected in parallel with the first constant current source CS1. The drain of the Nch transistor N4 is connected to a connection point of the second constant current source CS2 and the Nch transistor N1. The source of the Nch transistor N4 is connected to the ground. Namely, the Nch transistor N4 is connected in parallel with the second constant current source CS2.

An input of the inverter INV1 receives the switching signal Vc. An output of the inverter INV1 is connected to an input of the inverter INV2 and the gate of the Nch transistor N4. An output of the inverter INV2 is connected to the gate of the Pch transistor P4. Namely, the switching signal Vc is input to the gate of the Pch transistor P4, and an inversion signal of the switching signal Vc is input to the gate of the Nch transistor N4. Accordingly, the Pch transistor P4 and the Nch transistor N4 are uniformly turned on/off.

Figure 3:
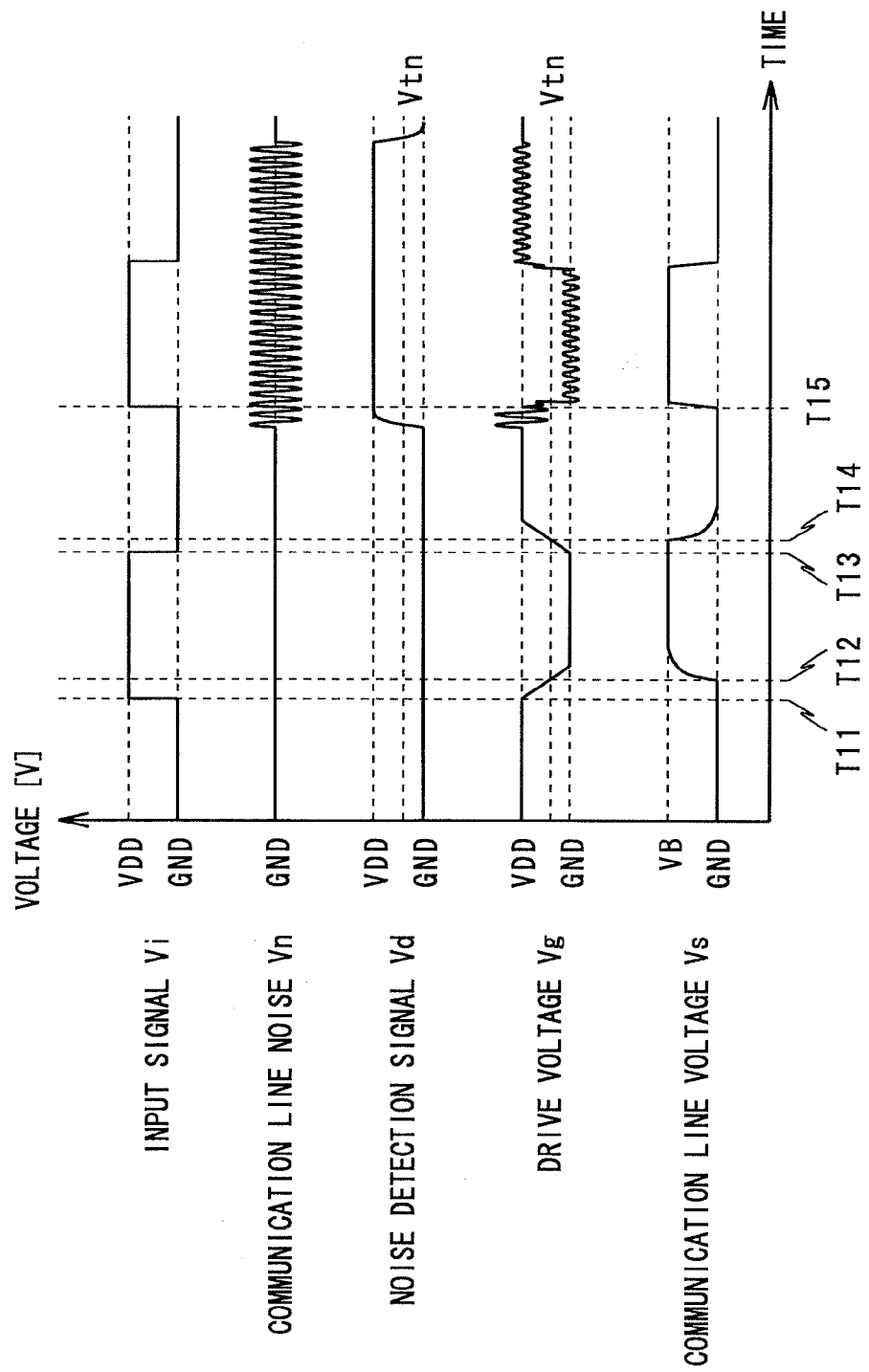
FIG. 3 is a timing chart showing operation of the serial communication apparatus 100 according to the first embodiment.

Subsequently, operation of the serial communication apparatus 100 will be described. First, there will be described a normal operation mode in which the serial communication apparatus 100 performs slew rate control. FIG. 3 is a timing chart showing operation of the serial communication apparatus 100 according to the first embodiment. Timings T11 to T14 of FIG. 3 correspond to the normal operation mode.

The input signal Vi is input to the serial communication apparatus 100 through the input terminal Tin. At first, a voltage level of the input signal Vi is assumed to be a Low level. At this time, the Pch transistor P1 is on, and the Nch transistor N1 is off. Consequently, the power supply voltage VDD is applied to the gate of the Nch transistor N2 through the first constant current source CS1 and the Pch transistor P1. Accordingly, the drive voltage Vg is equal to the power supply voltage VDD. As a result of this, the Nch transistor N2 is turned on, and the communication line voltage Vs becomes almost equal to a ground voltage. At this time, the gate-to-source capacitance Cgs of the Nch transistor is in a charged state by the drive voltage Vg (power supply voltage VDD) being applied.

When a voltage level of the input terminal Tin transitions from a Low level to a High level, the Pch transistor P1 is turned off, and the Nch transistor N1 is turned on (a timing T11). As a result of this, charge charged in the gate-to-source capacitance Cgs is discharged to the ground through the Nch transistor N1 and the second constant current source CS2. Since a current I2 of the second constant current source CS2 is constant, the drive voltage Vg until it drops to the ground voltage is expressed by the following Expression (1).

$$Vg = VDD - (I2/Cgs) \times t \quad (1)$$

Namely, the drive voltage Vg drops in a constant slope by the second constant current source CS2 of the slew rate control circuit 1. As a result of it, the drive voltage Vg drops more slowly as compared with the input signal Vi. When the drive voltage Vg then drops to a threshold voltage Vtn of the Nch transistor N2, the Nch transistor N2 is turned off (a timing T12). As a result of it, the communication line voltage Vs slowly rises to the external power supply voltage VB.

Subsequently, when the voltage level of the input terminal Tin transitions from the High level to the Low level, the Pch transistor P1 is turned on, and the Nch transistor N1 is turned off (a timing T13). As a result of this, a current flows in the Pch transistor P1 and the first constant current source CS1, and the gate-to-source capacitance Cgs is charged. Since a current I1 of the first constant current source CS1 is constant, the drive voltage Vg until it rises to the power supply voltage is expressed by the following Expression (2).

$$Vg = (I1/Cgs) \times t \quad (2)$$

Namely, the drive voltage Vg rises in a constant slope by the first constant current source CS1 of the slew rate control circuit 1. As a result of it, the drive voltage Vg rises more slowly as compared with the input signal Vi. When the drive voltage Vg then rises to the threshold voltage Vtn of the Nch transistor N2, the Nch transistor N2 is turned on (a timing T14). As a result of it, the communication line voltage Vs slowly drops almost to the ground voltage.

Next, there will be described a malfunction prevention mode when the communication line noise Vn as high frequency noise is introduced into the communication line 5. In FIG. 3, a time subsequent to a timing T15 corresponds to the malfunction prevention mode.

When the communication line noise Vn as the high frequency noise is introduced into the communication line 5, a high frequency component of the communication line noise Vn is added to the drive voltage Vg through the drain-to-gate capacitance Cdg of the Nch transistor N2 (the timing T15). At this time, a variation amount ΔVg of the drive voltage Vg is expressed by the following Expression (3).

$$\Delta Vg = Vn \times Cdg/(Cgs+Cdg) \qquad (3)$$

In addition, the communication line noise Vn appears as the noise detection signal Vd through the capacitance C31 and the diode D1 of the noise detection circuit 31. It is to be noted that the capacitance C31 cuts a direct-current component of the communication line noise Vn, and passes only the high frequency component of the communication line noise Vn therethrough. The diode D1 rectifies the high frequency component of the communication line noise Vn that has passed through the capacitance C31. The capacitance C32 smooths the high frequency component of the rectified communication line noise Vn. As a result of this, the noise detection signal Vd, as shown in FIG. 3, becomes a signal that rises along with the introduction of the communication line noise Vn. At this time, the noise detection signal Vd is expressed by the following Expression (4). It is to be noted that VD1 in Expression (4) indicates a drop voltage in the diode D1.

$$Vd = ((Vn/2) - VD1) \times (C31/(C31+C32)) \qquad (4)$$

Here, there will be described operation of the mode switching circuit 4 before and after the communication line noise Vn is introduced into the communication line 5. Since the noise detection signal Vd is a ground potential in the mode switching circuit 4 at the time of the normal operation mode, the Nch transistor N3 is off. Consequently, since the switching signal Vc is a High signal, the Pch transistor P4 is off, and the Nch transistor N4 is off. That is, it can be understood that the serial communication apparatus 100 performs so-called slew rate control utilizing the constant current source at the time of the normal operation mode.

Meanwhile, when the communication line noise Vn is introduced into the communication line 5, the serial communication apparatus 100 shifts to the malfunction prevention mode. Specifically, when the noise detection signal Vd exceeds a threshold value of the Nch transistor N3, the Nch transistor N3 is turned on. Consequently, since the switching signal Vc is a Low signal, the Pch transistor P4 is turned on, and the Nch transistor N4 is turned on.

That is, in the malfunction prevention mode, a current flows into the output circuit 21 not only from the high-impedance first constant current source CS1 but from the low-impedance Pch transistor P4. Similarly, a current flows out of the output circuit 21 not only to the high-impedance second constant current source CS2 but to the low-impedance Nch transistor N4. In this case, the Pch transistor P4 and the Nch transistor N4 function as voltage sources.

Namely, the mode switching circuit 4 can drop an impedance of the slew rate control circuit 1 at the time of the malfunction prevention mode. Consequently, even if the high frequency component of the communication line noise Vn is added to the drive voltage Vg, the impedance of the slew rate control circuit 1 is low, and thus a variation range of the drive voltage Vg can be suppressed. As a result of this, even if the communication line noise Vn goes on the communication line, the drive voltage Vg can be prevented from varying straddling the threshold value of the Nch transistor N2, and thus it can be prevented that a communication error occurs due to the Nch transistor N2 being turned on at the unintended timing when it should be essentially turned off.

It is to be noted that since in this case, the impedance of the slew rate control circuit 1 drops, the drive voltage Vg changes steeply. Therefore, the communication line voltage Vs changes more steeply as compared with the time of the normal operation mode. Namely, when subjected to the communication line noise Vn, the serial communication apparatus 100 shifts to the malfunction prevention mode to reduce an effect of the noise by reducing a function of slew rate control. Note that it is needless to say that the serial communication apparatus 100 returns to the normal operation mode from the malfunction prevention mode when the communication line noise Vn has disappeared after the serial communication apparatus 100 has been subjected to the communication line noise Vn.

Therefore, according to the configuration, a serial communication apparatus can be provided that can suitably prevent a communication error caused by the lack of a communication waveform, even when a communication line is subjected to noise.

Second Embodiment

Figure 4:
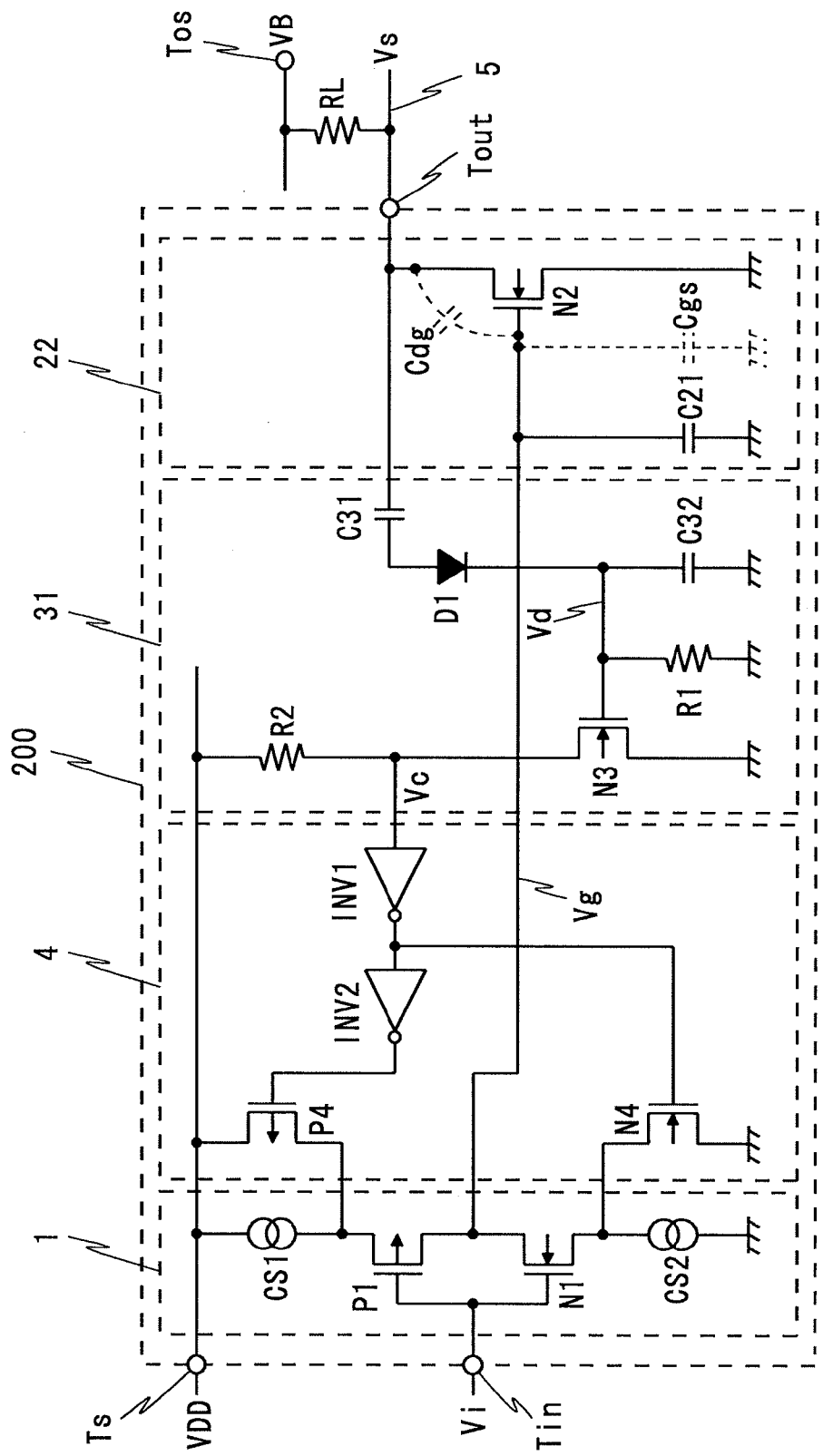
FIG. 4 is a circuit diagram showing a configuration of a serial communication apparatus 200 according to a second embodiment.

There will be described a serial communication apparatus 200 according to a second embodiment of the present invention. FIG. 4 is a circuit diagram showing a configuration of the serial communication apparatus 200 according to the second embodiment. The serial communication apparatus 200 has the configuration in which the output circuit 21 of the serial communication apparatus 100 has been replaced by an output circuit 22. The output circuit 22 has a configuration in which a capacitance C21 is added between the gate of the Nch transistor N2 and the ground as compared with the output circuit 21. The capacitance C21 corresponds to a fourth capacitance. Since other configurations of the serial communication apparatus 200 are similar to those of the serial communication apparatus 100, description thereof is omitted.

The serial communication apparatus 200 differs in operation from the serial communication apparatus 100 since the capacitance C21 has been added to the serial communication apparatus 200. In the serial communication apparatus 200, the drive voltage Vg until it drops to the ground voltage is expressed by the following Expression (5).

$$Vg = VDD - (I2/(Cdg+Cgs+C21)) \times t \qquad (5)$$

In addition, the drive voltage Vg until it rises to the power supply voltage is expressed by the following Expression (6).

$$Vg = (I1/(Cdg+Cgs+C21)) \times t \qquad (6)$$

From Expressions (5) and (6), by setting a capacitance value of the capacitance C21, it is possible to control a change rate of the drive voltage Vg that has been decided until then by a process structure, an element size, and the first constant current source CS1 and the second constant current source CS2. Namely, the serial communication apparatus 200 can appropriately adjust a slew rate of an output by adjusting the capacitance value.

Figure 5:
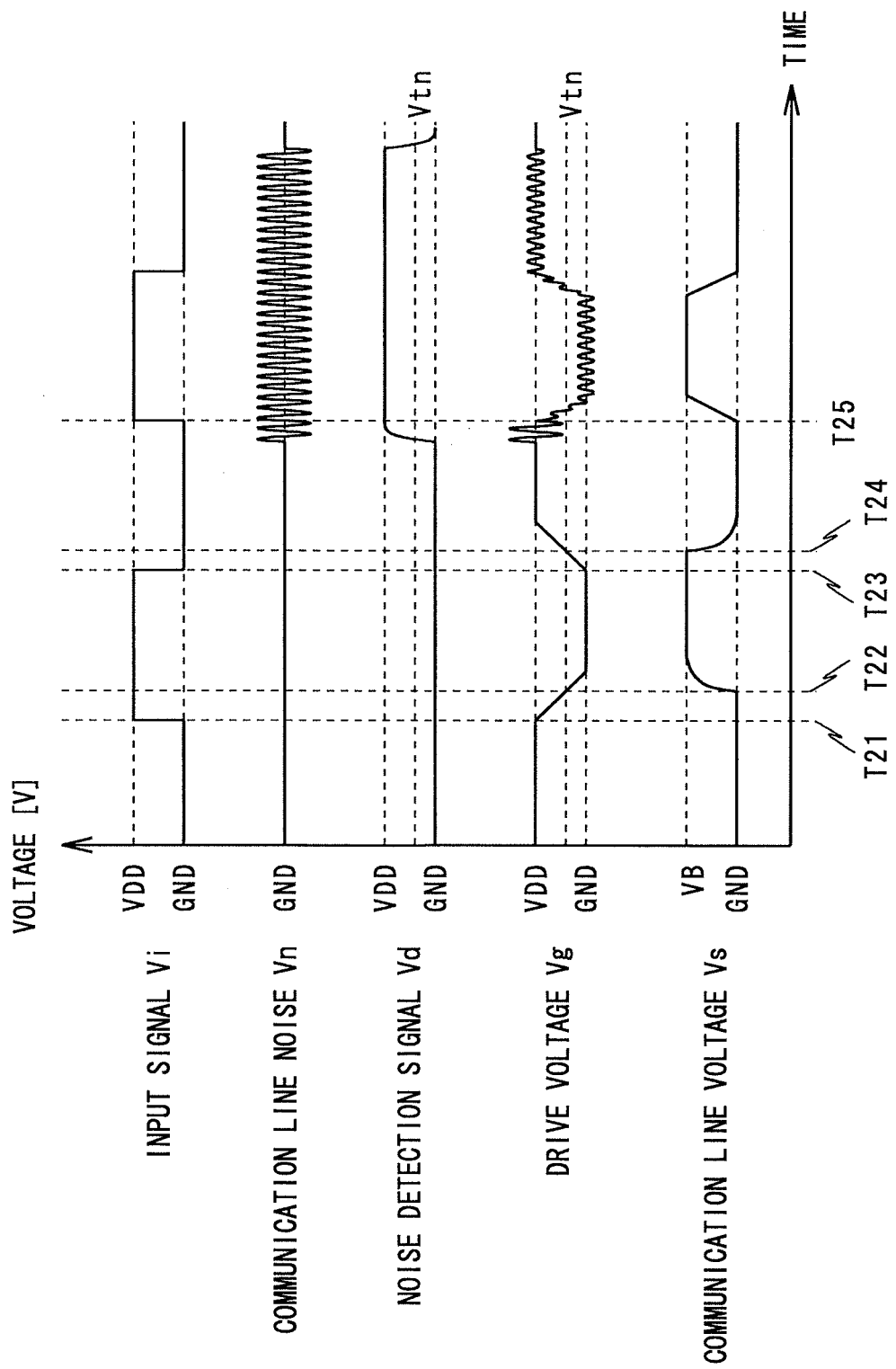
FIG. 5 is a timing chart showing operation of the serial communication apparatus 200 according to the second embodiment.

FIG. 5 is a timing chart showing operation of the serial communication apparatus 200 according to the second embodiment. Timings T21 to T25 of FIG. 5 correspond to the timings T11 to T15 of FIG. 3, respectively. As shown in FIG. 5, change of the drive voltage Vg can be made slower as compared with the serial communication apparatus 100 (refer to FIG. 3) by providing the capacitance C21.

In addition, a variation amount ΔVg of the drive voltage Vg when the communication line noise Vn as high frequency noise is introduced into the communication line 5 is expressed by the following Expression (7).

$$\Delta Vg = Vn \times Cdg/(Cgs+Cdg+C21) \quad (7)$$

From Expression (7), the variation amount of the drive voltage Vg can be relieved by increasing the capacitance value of the capacitance C21. Since operation other than the variation of the drive voltage Vg of the serial communication apparatus 200 is similar to that of the serial communication apparatus 100, description thereof is omitted.

As described above, according to the configuration, a serial communication apparatus can be provided that not only exerts an operational effect similar to the serial communication apparatus 100, but can perform slew rate adjustment, and that can suppress the variation of the drive voltage Vg when subjected to the communication line noise. Furthermore, according to the configuration, deterioration of a slew rate control function can also be suppressed at the time of the malfunction prevention mode.

Third Embodiment

Figure 6:
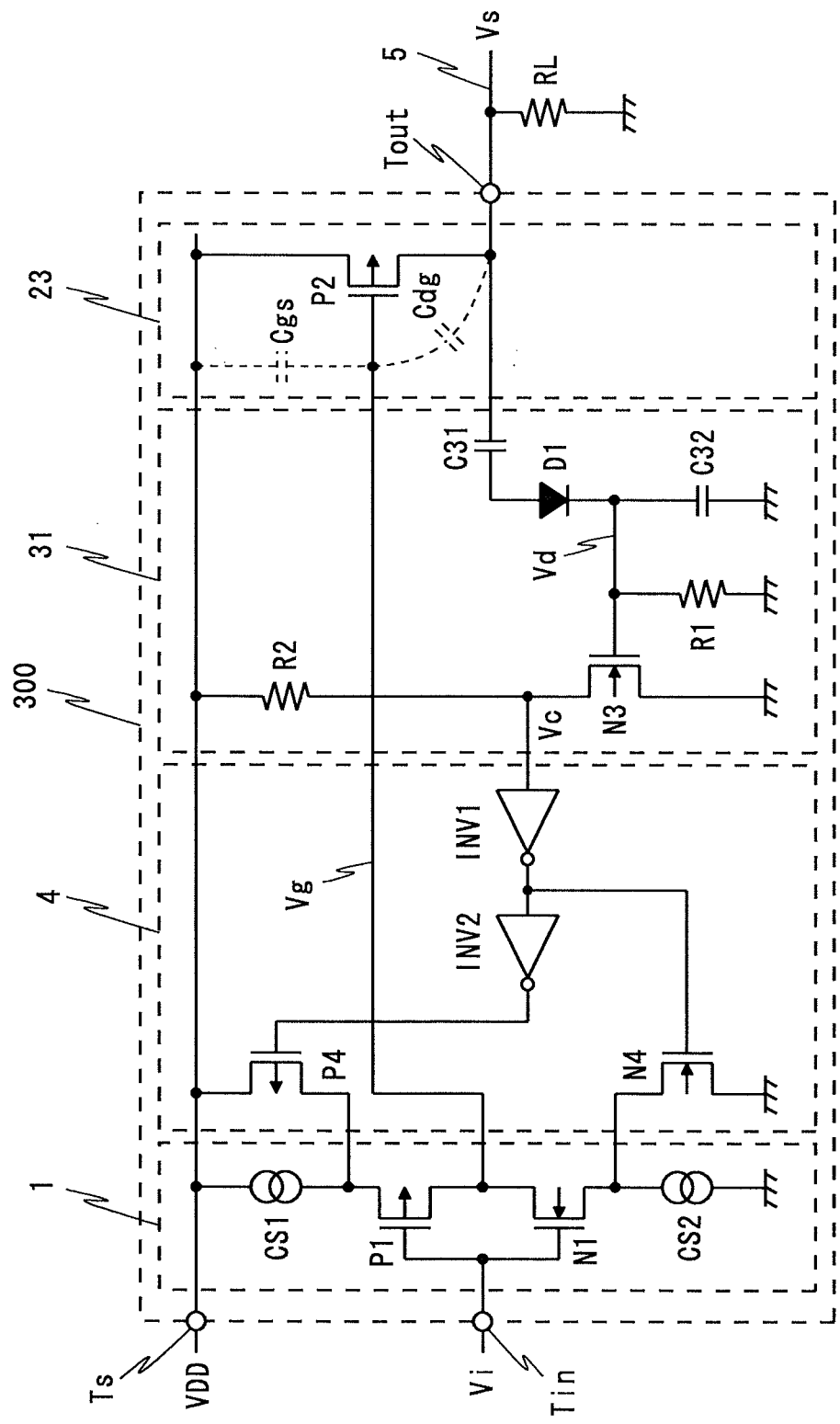
FIG. 6 is a circuit diagram showing a configuration of a serial communication apparatus 300 according to a third embodiment.

There will be described a serial communication apparatus 300 according to a third embodiment of the present invention. FIG. 6 is a circuit diagram showing a configuration of the serial communication apparatus 300 according to the third embodiment. The serial communication apparatus 300 has a configuration in which the output circuit 21 of the serial communication apparatus 100 has been replaced by an output circuit 23. The output circuit 23 has a configuration in which the Nch transistor N2 of the output circuit 21 has been replaced by the Pch transistor P2. The output terminal Tout of the serial communication apparatus 300 is connected to the ground through the communication line 5 and the load RL.

The source of the Pch transistor P2 is connected to the power supply terminal Ts. The drain of the Pch transistor P2 is connected to the output terminal Tout. The drive voltage Vg is applied to the gate of the Pch transistor P2. It is to be noted that the drain-to-gate capacitance Cdg exists between the drain and the gate of the Pch transistor P2. In addition, the gate-to-source capacitance Cgs exists between the gate and the source of the Pch transistor P2. In FIG. 6, the drain-to-gate capacitance Cdg and the gate-to-source capacitance Cgs are represented by dotted lines. Since other configurations of the serial communication apparatus 300 are similar to those of the serial communication apparatus 100, description thereof is omitted.

Figure 7:
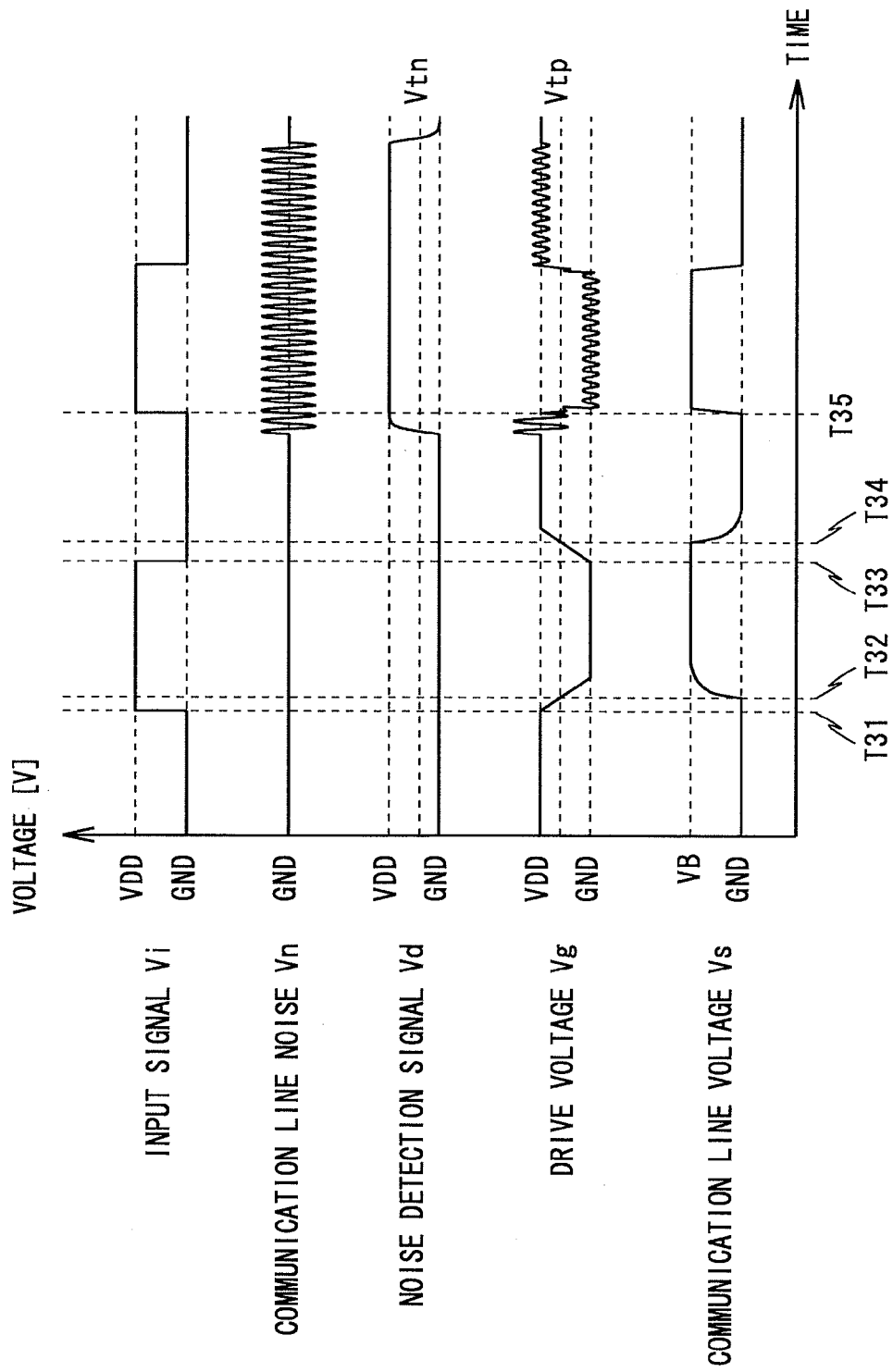
FIG. 7 is a timing chart showing the operation of the serial communication apparatus 300 according to the third embodiment.

Subsequently, operation of the serial communication apparatus 300 will be described. The serial communication apparatus 300 differs in operation of the normal operation mode as compared with the serial communication apparatus 100. Hereinafter, operation of the serial communication apparatus 300 in the normal operation mode will be described. It is to be noted that since the operation of the serial communication apparatus 300 in the malfunction prevention mode is similar to that of the serial communication apparatus 100, description thereof is omitted. FIG. 7 is a timing chart showing the operation of the serial communication apparatus 300 according to the third embodiment. Timings T31 to T34 of FIG. 7 correspond to the normal operation mode.

The input signal Vi is input to the serial communication apparatus 300 through the input terminal Tin. At first, a voltage level of the input signal Vi is Low. At this time, the Pch transistor P1 is turned on, and the Nch transistor N1 is turned off. Consequently, the power supply voltage VDD is applied to the gate of the Pch transistor P2 through the first constant current source CS1 and the Pch transistor P1. Accordingly, the drive voltage Vg is equal to the power supply voltage VDD. As a result of this, the Pch transistor P2 is turned off, and the communication line voltage Vs becomes a ground voltage. At this time, since voltages of both ends of the gate-to-source capacitance Cgs of the Pch transistor P2 are the power supply voltage VDD, the gate-to-source capacitance Cgs is in a state of not being charged.

When a voltage level of the input terminal Tin transitions from Low to High, the Pch transistor P1 is turned off, and the Nch transistor N1 is turned on (the timing T31). As a result of this, a current flows in the Nch transistor N1 and the second constant current source CS2, and the gate-to-source capacitance Cgs is charged. Since the current I2 of the second constant current source CS2 is constant, the drive voltage Vg until it drops to the ground voltage is expressed by the above-mentioned Expression (1).

Namely, the drive voltage Vg drops more slowly as compared with the input signal Vi similarly to the serial communication apparatus 100. When the drive voltage Vg then drops to a threshold voltage Vtp of the Pch transistor P2, the Pch transistor P2 is turned on (the timing T32). As a result of it, the communication line voltage Vs slowly rises to the external power supply voltage VB.

Subsequently, when the voltage level of the input terminal Tin transitions from High to Low, the Pch transistor P1 is turned on, and the Nch transistor N1 is turned off (the timing T33). As a result of this, a current flows in the Pch transistor P1 and the first constant current source CS1, and the gate-to-source capacitance Cgs is discharged. Since the current I1 of the first constant current source CS1 is constant, the drive voltage Vg until it rises to the power supply voltage is expressed by the above-mentioned Expression (2).

Namely, the drive voltage Vg rises more slowly as compared with the input signal Vi similarly to the serial communication apparatus 100. When the drive voltage Vg then rises to the threshold voltage Vtp of the Pch transistor P2, the Pch transistor P2 is turned off (the timing T34). As a result of it, a voltage of the communication line 5 slowly drops to the ground voltage.

As described above, although the serial communication apparatus 300 differs in the configuration of the output circuit from the serial communication apparatus 100, it can perform the operation similar to the serial communication apparatus 100. Therefore, according to the configuration, a serial communication apparatus can be provided that can exert an operational effect similar to the serial communication apparatus 100.

Fourth Embodiment

Figure 8:
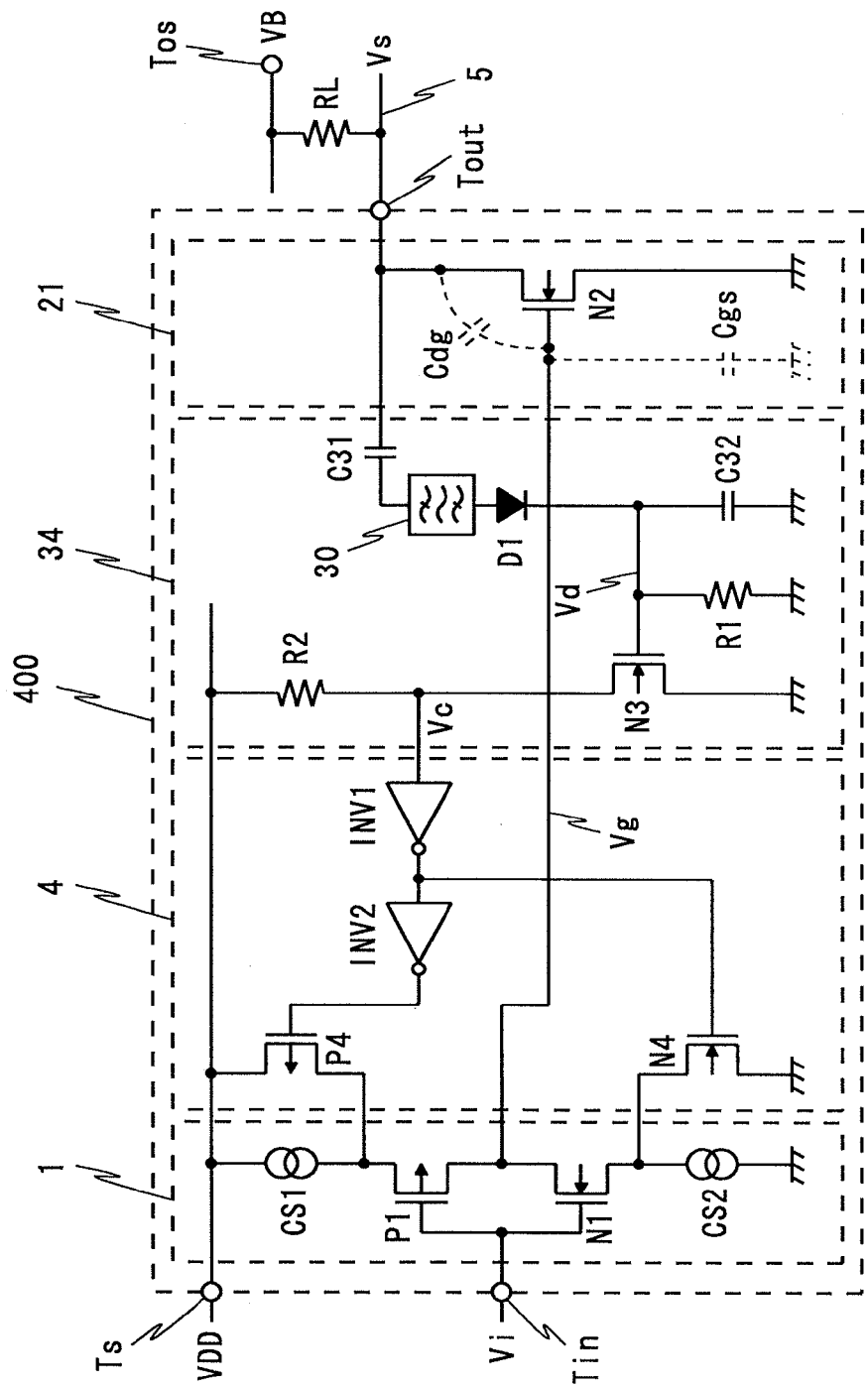
FIG. 8 is a circuit diagram showing a configuration of a serial communication apparatus 400 according to A fourth embodiment.
Figure 9:
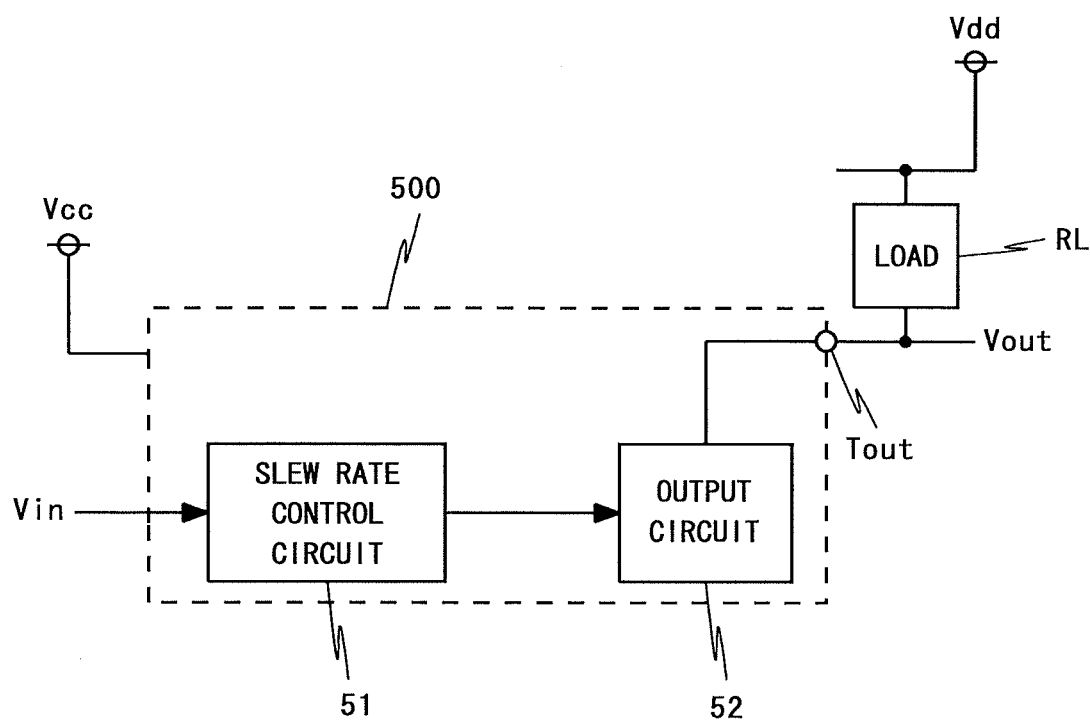
FIG. 9 is a block diagram showing a configuration of a slew rate output circuit 500.
Figure 10:
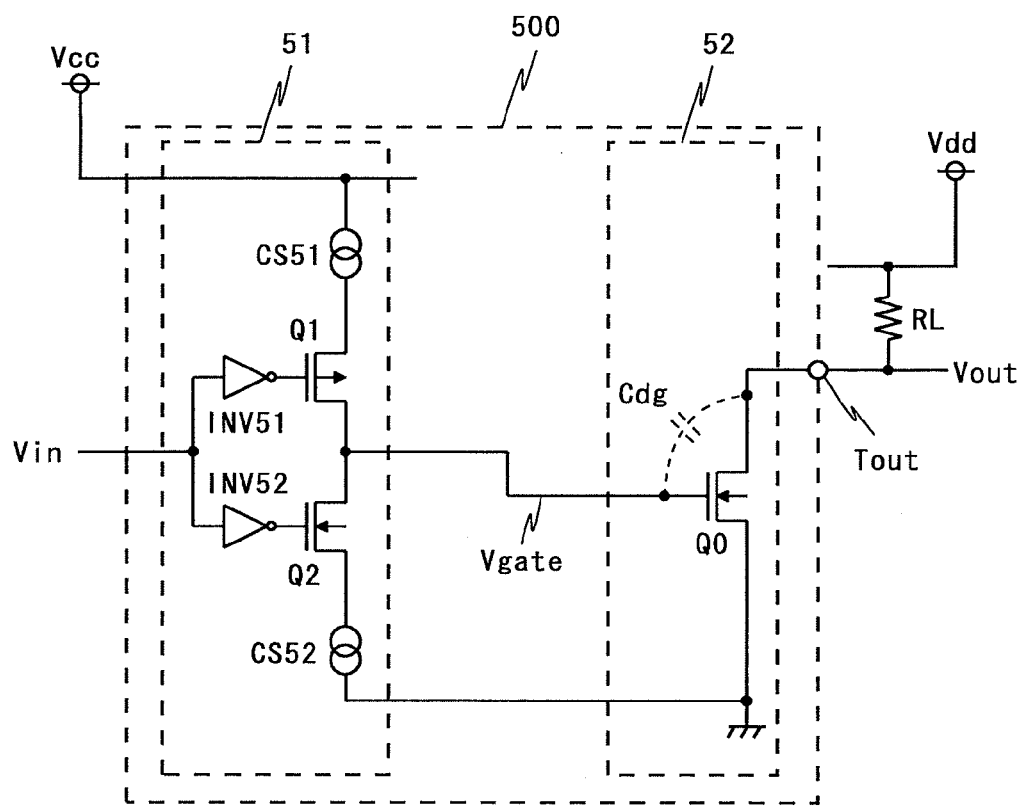
FIG. 10 is a circuit diagram showing the configuration of the slew rate output circuit 500.

There will be described a serial communication apparatus 400 according to a fourth embodiment of the present invention. FIG. 8 is a circuit diagram showing a configuration of the serial communication apparatus 400 according to the fourth embodiment. The serial communication apparatus 400 has the configuration in which the noise detection circuit 31 of the serial communication apparatus 100 has been replaced by a noise detection circuit 34. The noise detection circuit 34 has a configuration in which a filter 30 has been added between the capacitance C32 and the diode D1 of the noise detection circuit 31.

Generally, an effect of the noise in a serial communication apparatus becomes the most remarkable during transition to rise and fall of an input signal. Particularly, in the serial communication apparatus according to the above-mentioned embodiment, the voltage of the communication line 5 is changed by whether or not the drive voltage Vg that changes in the constant slope has reached the threshold value. When the serial communication apparatus is affected by noise in a case where the drive voltage Vg is a value near the threshold value, there is a large risk of occurrence of voltage variation straddling the threshold value. As a result of it, there is a risk that unintended on/off operation occurs in the transistor of the output circuit. As described above, a frequency of the noise having a high risk of affecting the rise and fall of the output signal may be specified by a system, and it is so-called harmonic noise having the frequency of an integral multiple of the input signal.

Therefore, in the serial communication apparatus 400, harmonic noise is selectively passed by providing the filter 30. As a result of this, malfunction when the serial communication apparatus 400 is subjected to specific harmonic noise can be prevented. In addition, the filter 30 prevents passage of noise having frequencies other than the harmonic noise. As a result of this, when having subjected to noise with a less effect as compared with the harmonic noise, the serial communication apparatus 400 maintains the normal operation mode, and can preferentially perform slew rate control. In other words, the serial communication apparatus 400 shifts to the malfunction prevention mode, only when having been subjected to noise with a frequency of a high occurrence probability of malfunction. The above-mentioned filter 30 can be easily achieved by a digital filter etc.

Consequently, according to the configuration, a serial communication apparatus can be provided that not only exerts an operational effect similar to the serial communication apparatus 100, but shifts to the malfunction prevention mode, only when having been subjected to the noise with the frequency of the high occurrence probability of malfunction. As a result of this, deterioration of the slew rate control function due to the shift to the malfunction prevention mode can be avoided, and an opportunity for the serial communication apparatus itself to be a noise source can be reduced.

It is to be noted that the present invention is not limited to the above-described embodiments, and it can be appropriately changed without departing from a subject matter. For example, similarly to the second embodiment, it is possible to add a capacitance between the Pch transistor P2 and the power supply terminal Ts of the output circuit 23 according to the third embodiment. In addition, similarly to the second embodiment, it is possible to add a capacitance between the Nch transistor N2 and the ground of the output circuit 21 according to the fourth embodiment.

Although the power supply terminal Ts, the ground, and the external power supply terminal Tos correspond to the first to third power supply terminals, respectively, a voltage supplied to the first to third power supply terminals is not limited to the above-mentioned example, and the voltage can be an arbitrary one as long as it can exert a function similar to the serial communication apparatuses according to the first to fourth embodiments. For example, the power supply voltage VDD and the external power supply voltage VB may be voltages different from each other, or may be the same voltage as each other. In addition, it is needless to say that a configuration can be employed in which a Pch transistor and an Nch transistor can be appropriately replaced.

An insertion position of the filter 30 of the noise detection circuit 34 according to the fourth embodiment is just an exemplification, and the filter 30 may be incorporated in another position as long as a high frequency component of the communication line noise can be selected by a frequency. In addition, it is possible to add a filter also to the detection circuits according to the second and third embodiments similarly to the fourth embodiment. Furthermore, it is also possible to apply a Pch transistor to the output circuit according to the fourth embodiment similarly to the output circuit 23 according to the third embodiment.

This application claims priority based on Japanese Patent Application No. 2011-78263 filed on Mar. 31, 2011, and the entire disclosure thereof is incorporated herein.

REFERENCE SIGNS LIST 1 and 51 Slew rate control circuit
4 Mode switching circuit
5 Communication Line
21 to 23, and 52 Output circuit
30 Filter
31 and 34 Noise detection circuit
100, 200, 300, and 400 Serial communication apparatus
500 Slew rate output circuit
C21, C31, and C32 Capacitance
C31 Capacitance
Cdg Drain-to-gate capacitance
Cgs Gate-to-source capacitance
CS1 First constant current source
CS2 Second constant current source
CS51 and CS52 Constant current source
D1 Diode
INV1, INV2, INV51, and INV52 Inverter
N1 to N4 Nch transistor
P1, P2, and P4 Pch transistor
Q0 Output transistor
Q1 P-channel transistor
Q2 N-channel transistor
R1 and R2 Resistor
RL Load
Tin Input terminal
Tos External power supply terminal
Tout Output terminal
Ts Power supply terminal
VB External power supply voltage
Vcc and Vdd Power supply line
Vd Noise detection signal
VDD Power supply voltage
Vg Drive voltage
Vgate Gate voltage
Vi Input signal
Vin Input pulse signal
Vn Communication line noise
Vout Output voltage

The invention claimed is:

1. A serial communication apparatus comprising:
   a slew rate control circuit that has a predetermined impedance, and supplies a constant current from an output according to an input signal;
   an output circuit that has a first capacitance charged and discharged by the constant current from the slew rate control circuit, and outputs from an output terminal a digital signal according to a drive voltage that the first capacitance outputs;
   a detection circuit that detects noise propagated from the output terminal, and outputs a switching signal according to a detection result; and
   a switching circuit that switches an impedance of the slew rate control circuit to a value smaller than the predetermined impedance according to the switching signal.

2. The serial communication apparatus according to claim 1, wherein
   the slew rate control circuit includes:
      a first constant current source that is turned on/off according to the input signal; and a second constant current source that is complementarily turned on/off with respect to the first constant current source according to the input signal, and the first capacitance is charged and discharged by being connected to a first power supply terminal through the first constant current source, or by being connected to a second power supply terminal through the second constant current source, the second power supply terminal being supplied a voltage different from the first power supply terminal.

3. The serial communication apparatus according to claim 2, wherein the switching circuit includes:
  a first transistor that is connected in parallel to the first constant current source; and
  a second transistor that is connected in parallel to the second constant current source, and
when the detection circuit detects the noise, the first and second transistors are turned on.

4. The serial communication apparatus according to claim 3, wherein the first transistor has a different channel type from the second transistor,
the switching signal is supplied to a control terminal of the first transistor, and
an inversion signal of the switching signal is supplied to a control terminal of the second transistor.

5. The serial communication apparatus according to claim 4, wherein the switching circuit further includes:
  a first inverter to which the switching signal is input, and whose output is connected to the control terminal of the second transistor; and
  a second inverter whose input is connected to the output of the first inverter, and whose output is connected to the control terminal of the first transistor.

6. The serial communication apparatus according to claim 3, wherein the detection circuit includes:
  a second capacitance whose one end is connected to the output terminal;
  a rectifier whose first terminal is connected to the other end of the second capacitance;
  a third capacitance and a first resistor whose one ends are connected to a second terminal of the rectifier, and whose other ends are connected to the second power supply terminal; and
  a second resistor and a third transistor that are connected in a cascade manner between the first power supply terminal and the second power supply terminal, and
a control terminal of the third transistor is connected to the second terminal of the rectifier, and outputs the switching signal from a connection point of the second resistor and the third transistor.

7. The serial communication apparatus according to claim 6, wherein the rectifier is a diode whose anode is connected to the second capacitance, and that outputs a detection signal from the cathode to the control terminal of the third transistor.

8. The serial communication apparatus according to claim 6, wherein the detection circuit further includes a filter that passes only an alternate current component of a predetermined frequency among alternate current components of the noise propagated through the output terminal.

9. The serial communication apparatus according to claim 8, wherein the filter is incorporated between the second capacitance and the rectifier.

10. The serial communication apparatus according to claim 3, wherein the output circuit includes a fourth transistor that is connected between the output terminal and the second power supply terminal, and whose control terminal is connected to the output of the slew rate control circuit,
the first capacitance is the capacitance between the control terminal and a terminal on a side of the output terminal of the fourth transistor, and
the output terminal is connected to a third power supply terminal through a load.

11. The serial communication apparatus according to claim 10, wherein the output circuit further includes a fourth capacitance that is connected between the second power supply terminal and the control terminal of the fourth transistor.

12. The serial communication apparatus according to claim 10, wherein the same voltage as to the first power supply terminal is supplied to the third power supply terminal.

13. The serial communication apparatus according to claim 10, wherein the same voltage as to the second power supply terminal is supplied to the third power supply terminal.

14. A serial communication apparatus comprising:
  an output circuit that drives a load connected to an output terminal;
  a slew rate control circuit that generates a drive signal for driving the output circuit according to an input signal, and controls a slew rate of the drive signal;
  a noise detection circuit that detects noise propagated to an output signal output from the output terminal; and
  a switching circuit that switches an impedance of the slew rate control circuit so that the impedance becomes smaller as compared with a case where the noise has not been detected, when the noise detection circuit detects the noise.

15. The serial communication apparatus according to claim 14, wherein in the slew rate control circuit, a slew rate is switched by the switching circuit.

16. The serial communication apparatus according to claim 14, wherein the slew rate control circuit drives the output circuit using a current source during a period when the noise is not detected, and drives the output circuit using a voltage source in addition to the current source during a period when the noise is detected.

* * * * *